United States Patent [19]
Drabik et al.

[11] Patent Number: 5,286,335
[45] Date of Patent: Feb. 15, 1994

[54] PROCESSES FOR LIFT-OFF AND DEPOSITION OF THIN FILM MATERIALS

[75] Inventors: Timothy J. Drabik; Nan M. Jokerst; Mark G. Allen; Martin A. Brooke, all of Atlanta, Ga.

[73] Assignee: Georgia Tech Research Corporation, Atlanta, Ga.

[21] Appl. No.: 865,119

[22] Filed: Apr. 8, 1992

[51] Int. Cl.$^5$ .......................... H01L 21/306
[52] U.S. Cl. .................. 156/631; 148/DIG. 100; 148/DIG. 135; 437/183; 437/924; 437/944; 437/974; 437/984
[58] Field of Search .............. 437/183, 974, 984, 924, 437/944; 148/DIG. 135, DIG. 100; 156/631

[56] References Cited

U.S. PATENT DOCUMENTS

| | | | |
|---|---|---|---|
| 3,959,045 | 5/1976 | Antypas | 148/DIG. 135 |
| 4,584,039 | 4/1986 | Shea | 156/631 |
| 4,604,160 | 8/1986 | Murakami et al. | 156/631 |
| 4,846,931 | 7/1989 | Gmitter et al. | 156/633 |
| 5,171,712 | 12/1992 | Wang et al. | 437/183 |

FOREIGN PATENT DOCUMENTS

62-285432  12/1987  Japan .................. 437/183

OTHER PUBLICATIONS

E. Yablonovitch et al., "Double Heterostructure GaAs/AlGaAs Thin Film Diode Lasers..." *IEEE Photonics Tech. Letts.*, vol. 1, No. 2, Feb. 1989, pp. 41–42.
I. Pollintier et al., "Fabrication of a GaAs-AlGaAs Grin-Sch Sqw Laser Diode", *IEEE Photonics Tech. Letts.*, vol. 3, No. 2, Feb. 1991, pp. 115–117.
H. Choi et al., "Monolithic Integration of GaAs/AlGaAs LED and Si Driver Circuit", *IEEE Electron Dev. Lett.*, vol. 9, pp. 512–514, 1988.
M. G. Allen, et al., "Microfabricated Structures for the In-Situ Measurement of Residual Stress, Young's Modulus, and Ultimate Strain of Thin Films", *Applied Physics Letters*, vol. 51, No. 4, pp. 241–244, 1987.

*Primary Examiner*—Brian E. Hearn
*Assistant Examiner*—Laura M. Holtzman
*Attorney, Agent, or Firm*—Hopkins & Thomas

[57] ABSTRACT

Novel processes permit integrating thin film semiconductor materials and devices using epitaxial lift off, alignment, and deposition onto a host substrate. One process involves the following steps. An epitaxial layer(s) is deposited on a sacrificial layer situated on a growth substrate. Device layers may be defined in the epitaxial layer. All exposed sides of the epitaxial layer is coated with a transparent carrier layer. The sacrificial layer is then etched away to release the combination of the epitaxial layer and the transparent carrier layer from the growth substrate. The epitaxial layer can then be aligned and selectively deposited onto a host substrate. Finally, the transparent carrier layer is removed, thereby leaving the epitaxial layer on the host substrate. An alternative process involves substantially the same methodology as the foregoing process except that the growth substrate is etched away before the sacrificial layer.

25 Claims, 3 Drawing Sheets

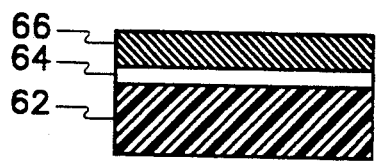
Fig. 1A
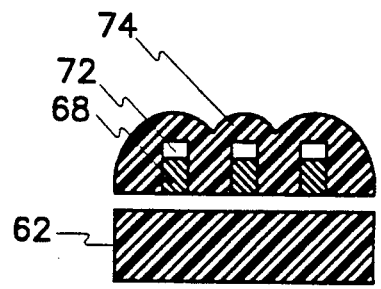
Fig. 1E
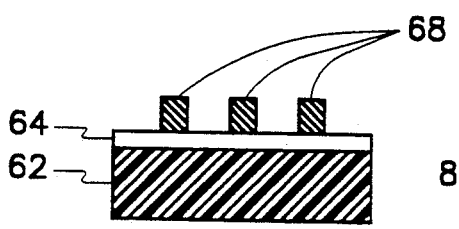
Fig. 1B
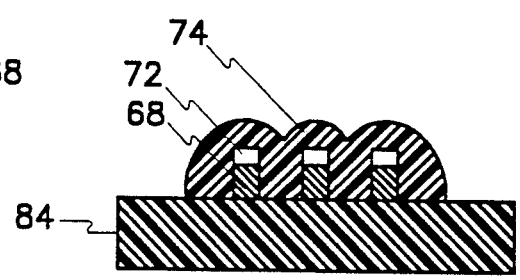
Fig. 1F
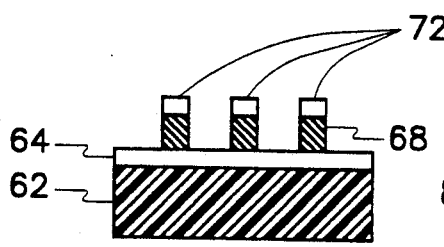
Fig. 1C
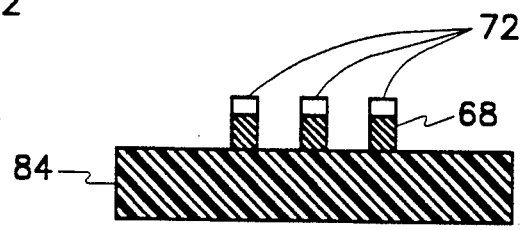
Fig. 1G
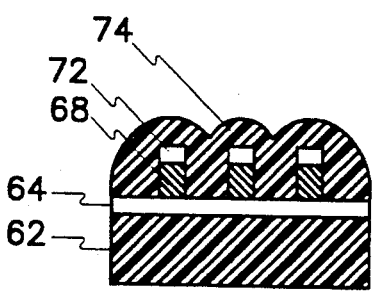
Fig. 1D
Fig. 1

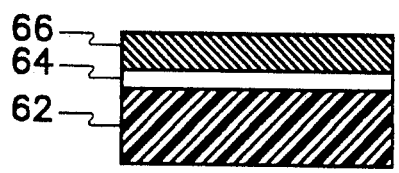
Fig. 3A
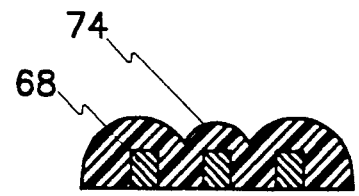
Fig. 3E
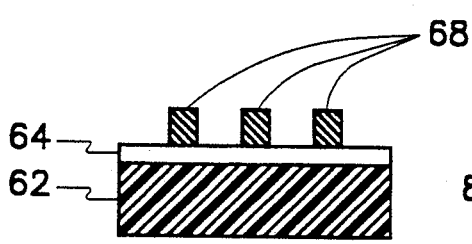
Fig. 3B
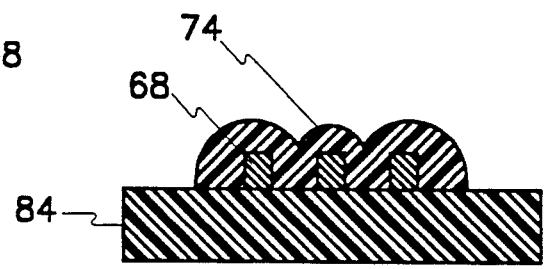
Fig. 3F
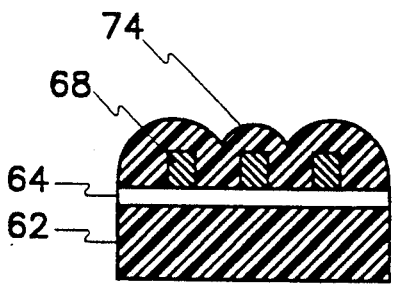
Fig. 3C
Fig. 3G
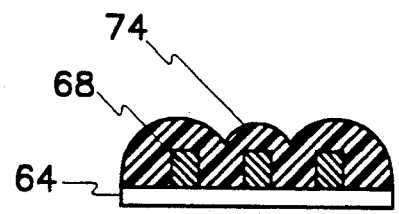
Fig. 3D
Fig. 3

PROCESSES FOR LIFT-OFF AND DEPOSITION OF THIN FILM MATERIALS

The U.S. government has a paid-up license in this invention and the right in limited circumstances to require the patent owner to license others on reasonable terms as provided for by the terms of Contract Number ECS90-58-144 awarded by the National Science Foundation.

FIELD OF THE INVENTION

The present invention generally relates to processes for fabricating integrated circuits, and more particularly, to a technology for integrating thin film semiconductor materials and devices using lift-off, alignment, and deposition onto a host substrate

BACKGROUND OF THE INVENTION

The monolithic integration of gallium arsenide (GaAs) photonic and electronic materials and devices with host substrates, such as silicon (Si), glass, and polymers, will enable the fabrication of the next generation of integrated circuits, particularly, integrated circuit "cubes" having a massive three dimensional communication network and optoelectronic integrated circuits. A standard technique for GaAs on Si integration is heteroepitaxial growth, which is described in H. Choi J. Mattia, G. Turner, and B. Y. Tsauer, "Monolithic Integration of GaAs/AlGaAs LED and Si Driver Circuit", *IEEE Electron Dev. Lett.*, vol.9, pp. 512-514, 1988, incorporated herein by reference. However, the crystal quality of this heteroepitaxial material is often inadequate for many optical applications.

An integration method which seeks to preserve the high material quality of lattice-matched growth is the epitaxial lift-off process developed by Bell Communications Research, Inc., (Bellcore), as described in E. Yablonovitch, T. J. Gmitter, J. P. Harbison, and R. Bhat, "Double Heterostructure GaAs/AlGaAs Thin Film Diode Lasers on Glass Substrates", *IEEE Phot. Tech. Lett.*, 1, pp. 41-42, 1989, incorporated herein by reference. Essentially, a thin aluminum arsenide (AlAs) sacrificial layer is grown on a GaAs substrate, and then GaAs/AlGaAs device epitaxial layers are grown on top of the AlAs layer. The GaAs/AlGaAs lattice-matched epitaxial layers are separated from the growth substrate by selectively etching the AlAs sacrificial layer. These device layers are then mounted in a hybrid fashion onto a variety of host substrates. The device layers are of high quality and are currently being used for the integration of GaAs/AlGaAs materials onto host substrates, such as Si, glass, lithium niobate, and polymers.

However, although the Bellcore epitaxial lift-off technique yields high quality material, use of the process is problematic. When using the Bellcore epitaxial lift-off technique, there is an inability to align and selectively deposit the thin film layers or devices.

SUMMARY OF THE INVENTION

The present invention provides novel processes for monolithically integrating thin film semiconductor materials and devices using separation, or "lift-off," alignment, and selective deposition onto a host substrate.

A novel epitaxial lift-off and alignable deposition process in accordance with the present invention comprises the following steps. An epitaxial layer(s) is deposited on a sacrificial layer situated on a growth substrate. Device layers may be defined in the epitaxial layer. All exposed sides of the epitaxial layer are coated with a transparent carrier layer. The sacrificial layer is then etched away to release the combination of the epitaxial layer and the transparent carrier layer from the growth substrate. The epitaxial layer can then be aligned and selectively deposited onto a host substrate. Finally, the transparent carrier layer is removed, thereby leaving the epitaxial layer on the host substrate.

An alternative epitaxial lift-off and alignable deposition process in accordance with the present invention comprises the following steps. An epitaxial layer(s) is deposited on a sacrificial, etch-stop layer situated on a growth substrate. Device layers may be defined in the epitaxial layer. All exposed sides of the epitaxial layer are coated with a transparent carrier layer. The growth substrate is then etched away, dissolved, or otherwise removed so as to release the combination of the sacrificial layer, the epitaxial layer and the transparent carrier layer. The sacrificial layer is then etched away to release the combination of the epitaxial layer and the transparent carrier layer from the growth substrate. The epitaxial layer can then be aligned and selectively deposited onto a host substrate. Finally, the transparent carrier layer is removed, thereby leaving the epitaxial layer on the host substrate.

The present invention overcomes the deficiencies of the prior art, as noted above, and further provides for the following additional features and advantages.

The present invention teaches lift-off, selective alignment, and selective deposition of thin film epitaxial materials. These processes are easily performed, inexpensive, and efficient.

The lift-off processes of the present invention provide a means for handling and depositing discrete devices which are too thin and delicate for manipulation by conventional means.

In accordance with the present invention, the thin film epitaxial materials which are lifted off could comprise, for example, $Al_xGa_{1-x}As$ materials (n-type or p-type) with a composition range of $0 \leq x \leq 1.0$, or as another example, could comprise $In_xGa_{1-x}As_yP_{1-y}$ materials (n-type or p-type) with a composition range of $0 < x < 1$ and $0 < y < 1$. The host substrate could comprise any host substrate, for example, silicon (Si), sapphire, glass, or polymers.

In accordance with the present invention, circuitry can be lifted off, and then independently optimized and/or tested before integration onto a host substrate for high yield and high performance.

The novel process of the present invention could also be used to bond piezoelectric transducers to acousto-optic substrates.

Light modulators or lasers can be placed in large numbers on a large silicon wafer.

Further features and advantages of the present invention will become apparent to one skilled in the art upon examination of the following drawings and the detailed description. It is intended that any additional features and advantages be incorporated herein.

BRIEF DESCRIPTION OF THE DRAWINGS

The present invention, as defined in the claims, can be better understood with reference to the following drawings.

FIGS. 1A through 1G collectively illustrate an epitaxial lift-off and alignable deposition process in accordance with the present invention wherein a carrier layer is utilized to lift-off and protect the epitaxial layer;

FIGS. 3A through 3G collectively illustrate an alternative epitaxial lift-off and alignable deposition process in accordance with the present invention.

DETAILED DESCRIPTION OF THE PREFERRED EMBODIMENTS

Figure 2:
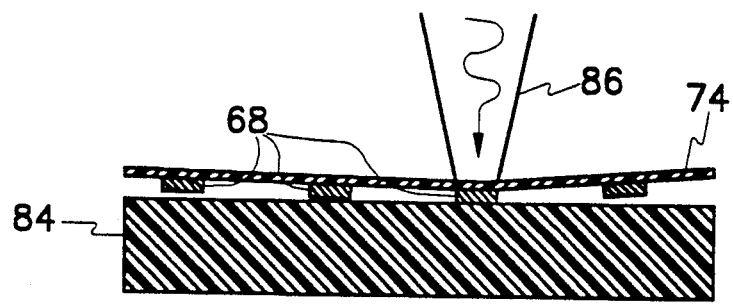
FIG. 2 illustrates selective deposition of a single epitaxial layer or device onto a host substrate without disturbance of the other epitaxial layers or devices in the carrier layer, in accordance with the present invention.

FIGS. 1A through 1G collectively illustrate an advanced epitaxial lift-off and deposition process wherein a carrier layer is utilized to lift off and protect device layers. The novel process provides for lifting-off thin film semiconductors having a thickness of typically between 1 and 20 micrometers.

With reference to FIG. 1A, a growth substrate 62 is provided with a sacrificial layer 64 and an epitaxial layer 66. The sacrificial layer 64 and epitaxial layer 66 are deposited on the growth substrate 62 using any conventional technique. "Depositing" in the context of this document refers to growing a substance on another or any other mechanism for disposing a substance on another.

In the preferred embodiment, the growth substrate 62 is GaAs. The sacrificial layer 64 is a thin layer of aluminum gallium arsenide $Al_xGA_{1-x}As$, where $0.6 \leq x \leq 1.0$. Moreover, the epitaxial layers 66 comprise GaAs-based compounds. For example, the epitaxial layers 66 can comprise $Al_xGa_{1-x}As$ with a composition range of $0 < x < 1.0$.

Mesa etch processing is then used to define one or more device layers 68 from the epitaxial layer 66. The mesa etch uses, for example, a photoresist mask and is performed using, for example, $H_2SO_4:H_2O_2:H_2O(1:8:160)$ as a fast gross etch with a final selective etch of $NH_4OH:H_2O_2(1:200)$ which stops at the AlAs sacrificial layer 64.

FIG. 1C shows that other processing steps, such as contact definition, can occur on the device layers 68 either before or after the mesa etch. As shown in FIG. 1C, metal contacts or dielectric layers 72 can be deposited on the device layers 68. Deposition of these layers 72 can occur using any of numerous conventional techniques. In the preferred embodiment, metal contacts 72 are bonded to the device layers 68 via vacuum deposition.

The device layers 68 with metal contacts 72, if applicable, are completely coated with a carrier layer 74. In the preferred embodiment, the carrier layer 74 is either a transparent polyimide or other organic material which itself can be made to act as a release layer. Apiezon W, which is essentially a black, opaque wax, can also be utilized as described in U.S. Pat. No. 4,846,931 to Gmitter et al. of Bellcore, the disclosure of which is incorporated herein by reference. Furthermore, it is also possible that the carrier layer 74 could be a metal, which has been evaporated, sputtered, and/or plated over the device layers 68. However, use of a transparent polyimide is preferred for several reasons. Because of its transparency, device layers 68 can be viewed while encapsulated and therefore aligned as will be further discussed hereinafter. Moreover, polyimides exhibit the desirable mechanical property of being under residual tensile stress at room temperature. See Allen, M. G.,
Mehregany, M., Howe, R. T., and Senturia, S. D., "Microfabricated Structures for the In-Situ Measurement of Residual Stress, Young's Modulus, and Ultimate Strain of Thin Films," *Applied Physics Letters*, Volume 51, No. 4, pp. 241-244, 1987, incorporated herein by reference. Finally, the thermal properties of polyimides are excellent. Temperatures in excess of 400° C. can be maintained without damage to the polyimide or device layers 68 protected thereby.

Next, as shown in FIG. 1E, the sacrificial layer 64 is etched away using a standard $HF:H_2O$ (1:10) etch solution to separate the device layers 68 and surrounding carrier layer 74 from the growth substrate 62, as shown in FIG. 1E. In accordance with a significant aspect of the present invention, metal layers (e.g., Al) or $Al_xGa_{1-x}As$ layers where $x < 0.4$ can be included in the device layers 68, because the device layers 68 are protected on their sides from the etch solution $HF:H_2O$ (1:10) by layer 74. For a further discussion, see I. Pollentier, L. Buydens, P. Van Daele, P. Demeester, "Fabrication of GaAs—AlGaAs GRIN—SCH SQW Laser Diode on Silicon by Epitaxial Lift-Off," *IEEE Phot. Tech. Lett.*, 3, 2, pp. 115-117, 1991, the disclosure of which is incorporated herein by reference.

After the combination of the device layers 68 and carrier layer 74 has been etched away from the substrate 62, the combination can easily be handled and transported.

The device layers 68 are next placed in contact with a host substrate 84, as shown in FIG. 1F. If the carrier layer 74 is a transparent polymer, alignment of the device layers 68 with particular circuitry on the host substrate 84 is easily accomplished.

The devices are adhered to the host substrate by a variety of methods, including Van der Waals bonding and/or metal-metal annealing.

After the device layers 68 have been aligned and positioned over desired locations on top of the host substrate 84, the carrier layer 74 is dissociated from the device layers 68. The dissociation can be effectuated using many techniques.

For example, the bond between device layers 68 and the carrier layer 74 can be broken by the following well known methods: (1) thermally, for example, through spot heating or through local application of high-intensity laser light, (2) photolytically through local exposure to short-wavelength laser light, (3) photochemically through local exposure to short-wavelength laser light in the presence of a reactive gas, or (4) chemically by etching or dissolution. As shown in FIG. 2, local activation of the bonding reaction by a confined application of heat or light enables selective deposition and bonding of a single epitaxial layer or device to a situs on the host substrate 84 without disturbing the remaining layers or devices in the carrier layer 74. A bonding head 86 exerts downward force on the carrier layer 74, thereby forcing one of the epitaxial layers or devices 68 into intimate contact with a bonding situs on the host substrate 84. Heat may be applied by conduction, or if the bonding head 86 is transparent, laser illumination can be used to activate the deposition and bonding. Thus, devices which were grown close together can be bonded sparsely, enabling a small growth substrate to provide sufficient devices for a large host substrate. Alternatively, an entire array of devices can be deposited.

After dissociation, the device layers 68 are in contact with the desired locations on the host substrate 84, as indicated in FIG. 1G. Preferably, the operation in FIG. 1G is performed within a clean room. Moreover, the host substrate 84 can comprise a Si or GaAs circuit which has been developed and optimized in a foundry independent of the device layers 68. An oven-annealing step may be desirable at this point to further consolidate and strengthen the bonds between the device layers 68 and the host substrate 84. Furthermore, a whole-wafer cleaning might also be carried out to remove any residual carrier layer material.

Another aspect of the epitaxial lift-off and deposition technique is that a peripheral frame (not shown) can be bonded to the carrier layer 74 before the growth substrate 62 is freed. The peripheral frame can help in handling and aligning the device layers 68. The assembly would resemble a mounted pellicle after release from the growth substrate 62.

FIGS. 3A through 3G collectively illustrate an alternative epitaxial lift-off and alignable deposition process in accordance with the present invention. The alternative process can be utilized to lift off, align, and deposit $In_xGa_{1-x}As_yP_{1-y}$ materials, where $0<x<1$ and $0<y<1$.

The steps of the process shown in FIGS. 3A-3C can be substantially similar to the steps shown and described with respect to FIGS. 1A-1D. However, in the process of FIG. 3, the growth substrate 62 is InP, the sacrificial layer 64 is $In_xGa_{1-x}As_yP_{1-y}$ material, where $0<x<1$ and $0<y<1$, and the epitaxial or device layer(s) 68 is $In_xGa_{1-x}As_yP_{1-y}$ material, where $0<x<1$ and $0<y<1$.

Moreover, after the carrier layer 74 has been applied in order to encapsulate the device layers 22 on the growth substrate 62, the InP growth substrate 62 is etched away, dissolved, or otherwise removed. In the preferred embodiment, a first etch solution can be, for example, $HCl:H_3PO_4$ (3:1). The first etch solution does not affect the InGaAsP sacrificial layer 64, as shown in FIG. 3D. Alternatively, a second etch solution, which can be, for example, $HF:H_2O_2:H_2O$ (1:1:10) or $H_2SO_4:H_2O_2:H_2O$ (1:1:1) in the preferred embodiment, can be applied to eliminate the InGaAsP sacrificial layer 64, as illustrated in FIG. 3E.

At this point, the device layers 68 can be selectively aligned and positioned onto the host substrate 84, as illustrated in FIG. 3F, depending upon the desired ultimate configuration of the device layers 68. Finally, the device layers 68 can be selectively deposited, as shown in FIG. 3G. The steps 3F and 3G can be performed similarly as steps 1F and 1G, respectively.

Those persons skilled in the art will readily appreciate the many modifications that are possible without materially departing from the novel teachings of the present invention. Accordingly, all such modifications are intended to be included within the scope of the present invention.

Wherefore, the following inventions are claimed:

1. A process for lift-off of thin film epitaxial materials, comprising the steps of:
   depositing an epitaxial layer on a sacrificial layer situated on a growth substrate;
   coating all exposed sides of said epitaxial layer with a transparent carrier layer, thereby encapsulating said epitaxial layer;
   etching away said sacrificial layer to separate the combination of said epitaxial layer and said carrier layer from said growth substrate;
   while separating said combination, preventing deformation of said epitaxial layer; and
   utilizing a carrier material for said carrier layer which permits dissociation of said epitaxial layer from said carrier layer after separating said combination without deformation of said epitaxial layer.

2. The process of claim 1, further comprising the steps of:
   placing said epitaxial layer over a position on a host substrate; and
   dissociating said carrier layer from said epitaxial layer to thereby deposit said epitaxial layer at said position on said host substrate.

3. The process of claim 1, further comprising the step of selectively aligning said epitaxial layer with said position on a host substrate.

4. The process of claim 1, further comprising the step of defining device layers in said epitaxial layer by selectively removing regions of said epitaxial layer.

5. The process of claim 1, wherein said epitaxial layer comprises a thin film semiconductor measuring less than 20 micrometers in thickness.

6. The process of claim 1, wherein said carrier layer comprises a polymeric layer.

7. The process of claim 1, further comprising the step of depositing a metal layer on said epitaxial layer.

8. The process of claim 1, further comprising the step of depositing a dielectric layer on said epitaxial layer.

9. The process of claim 1, further comprising the step of altering the mechanical properties of said carrier layer to separate said epitaxial layer from said carrier layer.

10. A process for lift-off and alignable deposition of thin film epitaxial materials, comprising the steps of:
    depositing an epitaxial layer on a sacrificial layer situated on a growth substrate;
    coating all exposed sides of said epitaxial layer with a transparent carrier layer, thereby encapsulating said epitaxial layer;
    etching away said sacrificial layer to separate the combination of said epitaxial layer and said carrier layer from said growth substrate;
    while separating said combination, preventing deformation of said epitaxial layer;
    placing said epitaxial layer over a position on a host substrate; and
    dissociating said carrier layer from said epitaxial layer to thereby deposit said epitaxial layer at said position on said host substrate.

11. The process of claim 10, further comprising the step of selectively aligning said epitaxial layer with said position on said host substrate.

12. The process of claim 10, further comprising the step of defining device layers in said epitaxial layer by selectively removing regions of said epitaxial layer.

13. The process of claim 10, wherein said epitaxial layer comprises a thin film semiconductor measuring less than 20 micrometers in thickness.

14. The process of claim 10, wherein said carrier layer comprises a polymeric layer.

15. The process of claim 10, further comprising the step of depositing a metal layer on said epitaxial layer.

16. The process of claim 10, further comprising the step of depositing a dielectric layer on said epitaxial layer.

17. The process of claim 10, further comprising the step of altering the mechanical properties of said carrier layer to separate said epitaxial layer from said carrier layer.

18. A process for lift-off and alignable deposition of thin film epitaxial materials, comprising the steps of:
   depositing an epitaxial layer on a sacrificial layer situated on a growth substrate;
   coating all exposed sides of said epitaxial layer with a transparent carrier layer, thereby encapsulating said epitaxial layer;
   etching away said growth substrate to separate the combination of said sacrificial layer, said epitaxial layer, and said carrier layer;
   etching away said sacrificial layer to separate the combination of said epitaxial layer and said carrier layer from said growth substrate;
   while separating said combination of said epitaxial layer and said carrier layer from said growth substrate, preventing deformation of said epitaxial layer;
   placing said epitaxial layer over a position on a host substrate; and
   dissociating said carrier layer from said epitaxial layer to thereby deposit said epitaxial layer at said position on said host substrate.

19. The process of claim 18, further comprising the step of selectively aligning said epitaxial layer with said position on said host substrate.

20. The process of claim 18, further comprising the step of defining device layers in said epitaxial layer by selectively removing regions of said epitaxial layer.

21. A process for lift-off of thin film epitaxial materials, comprising the steps of:
   depositing an epitaxial layer on a sacrificial layer situated on a growth substrate;
   coating all exposed sides of said epitaxial layer with a transparent carrier layer, thereby encapsulating said epitaxial layer;
   etching away said sacrificial layer to separate the combination of said epitaxial layer and said carrier layer from said growth substrate, said epitaxial layer being capable of separation from said carrier layer by altering the mechanical properties of said carrier layer;
   while separating said combination, maintaining the shape of said epitaxial layer so that said epitaxial layer remains substantially undisturbed; and
   utilizing a carrier material for said carrier layer which permits dissociation of said epitaxial layer from said carrier layer after separating said combination while maintaining said shape of said epitaxial layer so that said epitaxial layer remains undisturbed.

22. A process for lift-off and deposition of thin film epitaxial materials, comprising the steps of:
   depositing an epitaxial layer on a sacrificial layer situated on a growth substrate;
   coating all exposed sides of said epitaxial layer with a transparent carrier layer, thereby encapsulating said epitaxial layer;
   etching away said sacrificial layer to separate the combination of said epitaxial layer and said carrier layer from said growth substrate;
   while separating said combination, maintaining the shape of said epitaxial layer so that said epitaxial layer remains undisturbed;
   positioning said epitaxial layer over a position on a host substrate; and
   dissociating said carrier layer from said epitaxial layer to thereby deposit said epitaxial layer at said position on said host substrate.

23. A process for lift-off and deposition of thin film epitaxial materials, comprising the steps of:
   depositing an epitaxial layer on a sacrificial layer situated on a growth substrate;
   coating all exposed sides of said epitaxial layer with a transparent carrier layer, thereby encapsulating said epitaxial layer;
   etching away said sacrificial layer to separate the combination of said epitaxial layer and said carrier layer from said growth substrate;
   while separating said combination, minimizing deformation of said epitaxial layer;
   positioning said epitaxial layer over a position on a host substrate; and
   dissociating said carrier layer from said epitaxial layer to thereby deposit said epitaxial layer at said position on said host substrate.

24. A process for lift-off and deposition of thin film epitaxial materials, comprising the steps of:
   depositing an epitaxial layer on a sacrificial layer situated on a growth substrate;
   coating all exposed sides of said epitaxial layer with a transparent carrier layer, thereby encapsulating said epitaxial layer;
   etching away said growth substrate to separate the combination of said sacrificial layer, said epitaxial layer, and said carrier layer;
   etching away said sacrificial layer to separate the combination of said epitaxial layer and said carrier layer from said growth substrate;
   while separating said combination of said epitaxial layer and said carrier layer from said growth substrate, maintaining the shape of said epitaxial layer so that said epitaxial layer remains undisturbed;
   positioning said epitaxial layer at a position over a host substrate; and
   dissociating said carrier layer from said epitaxial layer to thereby deposit said epitaxial layer at said position on said host substrate.

25. A process for lift-off and deposition of thin film epitaxial materials, comprising the steps of:
   depositing an epitaxial layer on a sacrificial layer situated on a growth substrate;
   coating all exposed sides of said epitaxial layer with a transparent carrier layer, thereby encapsulating said epitaxial layer;
   etching away said growth substrate to separate the combination of said sacrificial layer, said epitaxial layer, and said carrier layer;
   etching away said sacrificial layer to separate the combination of said epitaxial layer and said carrier layer from said growth substrate;
   while separating said combination of said epitaxial layer and said carrier layer from said growth substrate, minimizing deformation of said epitaxial layer;
   positioning said epitaxial layer at a position over a host substrate; and
   dissociating said carrier layer from said epitaxial layer to thereby deposit said epitaxial layer at said position on said host substrate.

* * * * *